United States Patent
Gong et al.

(10) Patent No.: US 10,625,289 B2
(45) Date of Patent: Apr. 21, 2020

(54) MASK AND METHOD OF MANUFACTURING MASK ASSEMBLY INCLUDING THE SAME

(71) Applicant: SAMSUNG DISPLAY CO., LTD., Yongin-si, Gyeonggi-do (KR)

(72) Inventors: Su Cheol Gong, Cheonan-si (KR); Min Goo Kang, Seoul (KR); Taek Kyo Kang, Suwon-si (KR); Jung Woo Ko, Seoul (KR); Min Ju Kim, Cheonan-si (KR); Young Eun Ryu, Asan-si (KR); Jae Suk Moon, Seongnam-si (KR); Soo Hyun Min, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/651,034

(22) Filed: Jul. 17, 2017

(65) Prior Publication Data
US 2018/0071764 A1    Mar. 15, 2018

(30) Foreign Application Priority Data

Sep. 12, 2016    (KR) .......................... 10-2016-0117572

(51) Int. Cl.
| | |
|---|---|
| *B05C 21/00* | (2006.01) |
| *B23K 31/02* | (2006.01) |
| *B05B 12/20* | (2018.01) |
| *C23C 14/04* | (2006.01) |
| *B23K 103/04* | (2006.01) |
| *H01L 51/00* | (2006.01) |
| *H01L 51/56* | (2006.01) |

(52) U.S. Cl.
CPC ............ *B05B 12/20* (2018.02); *B05C 21/005* (2013.01); *B23K 31/02* (2013.01); *C23C 14/042* (2013.01); *B23K 2103/04* (2018.08); *H01L 51/0011* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 2011/0183271 | A1* | 7/2011 | Lee .......................... | B23K 26/38 430/323 |
| 2012/0266813 | A1* | 10/2012 | Hong .................... | C23C 14/042 118/505 |
| 2012/0328851 | A1* | 12/2012 | Kang ........................ | B32B 3/10 428/195.1 |

FOREIGN PATENT DOCUMENTS

| | | |
|---|---|---|
| KR | 10-2002-0016188 A | 3/2002 |
| KR | 10-2013-0053893 A | 5/2013 |
| KR | 10-2015-0103655 A | 9/2015 |

(Continued)

*Primary Examiner* — Jethro M. Pence
(74) *Attorney, Agent, or Firm* — Lewis Roca Rothgerber Christie LLP

(57) ABSTRACT

A mask and a method of manufacturing a mask assembly, the mask including a body, and the body including one end and another end facing each other in a length direction and having a first surface and a second surface facing each other in a thickness direction; and a pattern region between the one end and the other end, the pattern region including a plurality of pattern holes and a plurality of ribs between the plurality of pattern holes, wherein a curl value of the mask, which is defined as a shortest distance from a plane tangent to a center of the body to the one end or the other end of the body, is 1,000 μm to 4,000 μm.

6 Claims, 14 Drawing Sheets

(56) References Cited

FOREIGN PATENT DOCUMENTS

KR 10-1603200 B1 3/2016
KR 10-2016-0061568 A 6/2016

* cited by examiner

MASK AND METHOD OF MANUFACTURING MASK ASSEMBLY INCLUDING THE SAME

CROSS-REFERENCE TO RELATED APPLICATION

Korean Patent Application No. 10-2016-0117572, filed on Sep. 12, 2016, in the Korean Intellectual Property Office, and entitled: "Mask and Method of Manufacturing Mask Assembly Including the Same," is incorporated by reference herein in its entirety.

BACKGROUND

1. Field

Embodiments relate to a mask and a method of manufacturing a mask assembly including the same.

2. Description of the Related Art

An organic light-emitting display device, which is one of flat panel displays, is an active light-emitting display device, has a wide viewing angle and an excellent contrast, and can be driven at low voltage. Further, the organic light-emitting display device has attracted considerable attention as a next-generation display device because it has a fast response speed.

SUMMARY

Embodiments are directed to a mask and a method of manufacturing a mask assembly including the same.

The embodiments may be realized by providing a mask comprising a body, the body including one end and another end facing each other in a length direction and having a first surface and a second surface facing each other in a thickness direction; and a pattern region between the one end and the other end, the pattern region including a plurality of pattern holes and a plurality of ribs between the plurality of pattern holes, wherein a curl value of the mask, which is defined as a shortest distance from a plane tangent to a center of the body to the one end or the other end of the body, is 1,000 µm to 4,000 µm.

The body may contain nickel and iron, and a content of nickel may be 35 wt % to 40 wt %, based on a total weight of nickel and iron.

A thickness of at least one of the plurality of ribs may be 6 µm to 10 µm.

The body may include a first welding region at the one end and a second welding region at the other end.

A thickness of at least one of the first welding region and the second welding region may be greater than a thickness of at least one of the plurality of ribs.

The thickness of at least one of the first welding region and the second welding region may be 6 µm to 40 µm.

Each rib of the plurality of ribs may include an upper surface having a first length and a lower surface having a second length, the second length being longer than the first length.

The embodiments may be realized by providing a mask including a first welding region at one end of the mask; a second welding region at another end of the mask, the other end of the mask facing one end of the mask in a length direction; and a pattern region between the first welding region and the second welding region, wherein the pattern region includes a plurality of ribs, each rib including an upper surface having a first length and a lower surface having a second length that is longer than the first length, and wherein a curl value of the mask, which is defined as a shortest distance from a plane tangent to a center of the body to one of the first welding region and the second welding region, is 1,000 µm to 4,000 µm.

Each of the first welding region, the second welding region, and the pattern region may contain nickel and iron, and the content of nickel in the first welding region, the second welding region, and the pattern region may be 35 wt % to 40 wt %, based on a total weight of nickel and iron.

A thickness of at least one of the first and second welding regions may be equal to or greater than a thickness of the pattern region.

A thickness of the pattern region may be 6 µm to 10 µm.

The embodiments may be realized by providing a method of manufacturing a mask assembly, the method including forming a mask such that the mask has one surface and another surface facing each other in a thickness direction; and attaching the mask to a mask frame such that the one surface of the mask is in contact with the mask frame, wherein a curl value of the mask, which is defined as a shortest distance from a plane tangent to a center of the body to the one end or the other end of the body, is 1,000 µm to 4,000 µm.

The method may further include stretching the mask in a length direction after the forming the mask, wherein the mask attached to the mask frame has a curl value of 0 µm to 400 µm.

In the stretching the mask, the mask may be stretched by a tensile resultant force of 0.4 Kgf to 6.0 Kgf.

The mask may contain nickel and iron, and a content of nickel in the mask may be 35 wt % to 40 wt %, based on a total weight of nickel and iron.

The mask may include a first welding region at the one end of the mask in a length direction, a second welding region disposed at the other end of the mask facing the one end in the length direction, and a pattern region between the first welding region and the second welding region, and in the forming the mask, a thickness of at least one of the first and second welding regions may be equal to or greater than a thickness of the pattern region.

The thickness of the pattern region may be 6 µm to 10 µm.

Forming the mask may include forming a photoresist layer on a substrate; forming a photomask on the photoresist layer and etching at least a part of the photoresist layer using the photomask, so as to form a plurality of photoresist patterns spaced apart from each other; forming a metal layer between the plurality of photoresist patterns; and removing the plurality of photoresist patterns and the substrate.

Forming the metal layer may include applying a constant current to the metal layer.

The metal layer may be formed using a metal plating solution, and the metal layer is formed in an amount of 1 wt % to 10 wt %, based on a total weight of the metal plating solution.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
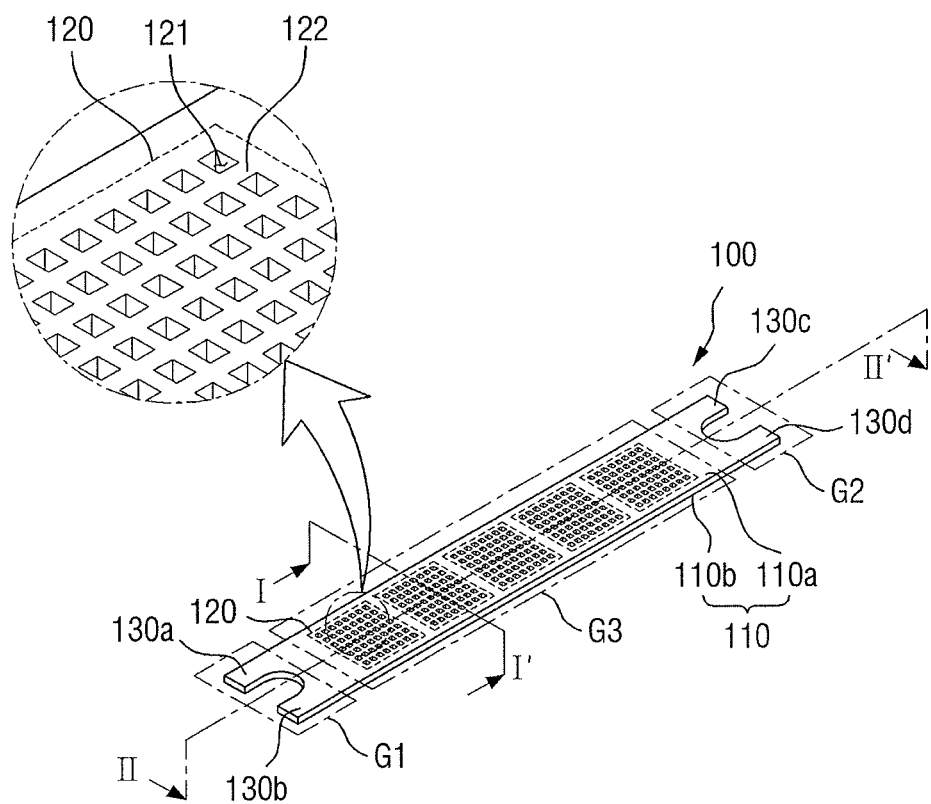
FIG. 1 illustrates a perspective view of a mask according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "X, Y, or Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments will be described in detail with reference to the attached drawings.

FIG. 1 illustrates a perspective view of a mask according to an embodiment.

A mask 100 may include end portions or ends in a length direction, surfaces in a thickness direction, and end portions or ends in a width direction. Here, the length direction may be a first direction X, the thickness direction may be a second direction Y, and the width direction may be a third direction Z. In the present specification, the length direction is defined as a stretching direction of the mask 100, which will be described later. Accordingly, when the width of a mask is smaller than the length of a mask, the size, shape and structure of the mask 100 are not limited to those shown in FIG. 1.

In an embodiment, the mask 100 may be a magnetic thin film. The mask 100 may contain nickel (Ni) and iron (Fe). In an implementation, a content of nickel (Ni) in the mask may be, e.g., 35 wt % to 40 wt %, based on a total weight of nickel (Ni) and iron (Fe).

The mask 100 may include a body 110. The mask 100 may include a plurality of patterns 120, e.g., in the body 110.

The body 110 may include a first surface 110a, which is one surface in the second direction (width direction), and a second surface 110b facing the first surface 110a. The first surface 110a may be a surface on which a deposition material is provided from a deposition source (400, refer to FIG. 7) to be described below. The second surface 110b may be a surface being in direct contact with a substrate (300, refer to FIG. 7).

The mask 100 may be divided into or include first and second welding regions G1 and G2 located at, e.g., both, ends in the length direction, and a pattern region G3 between the first and second welding regions G1 and G2.

The first and second welding regions G1 and G2 may be regions attached to a mask frame 200 to be described below. In an implementation, the first and second welding regions G1 and G2 may be attached to the mask frame 200 by, e.g., laser welding, resistance heating welding, or the like. For example, the mask 100 may be fixed on the mask frame 200 because the first and second welding regions G1 and G2 are respectively welded on the mask frame 200 in a state in which a predetermined tensile force is applied in the first direction X. The first welding region G1 may be symmetrical with the second welding region G2. In an implementation, the first welding region G1 and the second welding region G2 may be different from each other in shape, size, or the like, depending on the shape or the like of the mask frame 200. Hereinafter, in the present specification, the expression "attaching" will be defined as meaning that two components are combined by welding.

The first welding region G1 may include first and second clamping portions 130a and 130b. The second welding region G2 may include third and fourth clamping portions 130c and 130d. As described above, the mask 100 may be stretched by applying a predetermined force along the first direction X. In an implementation, the tensile resultant force applied to the mask 100 may be, e.g., about 0.4 Kgf to 6.0 Kgf. Here, the tensile resultant force refers to the resultant of tensile forces applied to the first to fourth clamping portions 130a to 130d. For example, the first to fourth clamping portions 130a to 130d may be provided for grasp-ing the mask 100. The first to fourth clamping portions 130a to 130d may be cut after welding is completed.

The pattern region G3 may be provided therein with a plurality of patterns 120. The plurality of patterns 120 may be spaced apart from each other at predetermined distances along the first direction X. In an implementation, as shown in FIG. 1, the number of the plurality of pattern units 120 may be five.

Each of the patterns 120 may include a plurality of pattern holes 121 and a plurality of ribs 122. The plurality of pattern holes 121 may transmit a deposition material. The plurality of ribs 122 may be disposed between the plurality of pattern holes 121. A suitable number and size of the pattern holes 121 may be included.

In an embodiment, a plating process may be additionally performed in the first and second welding regions G1 and G2, compared to the pattern region G3. Accordingly, a thickness of the first and second welding regions G1 and G2 may be different from the pattern region G3. In an implementation, the thickness of the pattern region G3 may be, e.g., about 6 µm to 10 µm. In an implementation, the thickness of each of the first and second welding regions G1 and G2 may be, e.g., about 10 µm to 40 µm. This will be described below with reference to FIG. 3.

The mask 100 may have a curl value of, e.g., about 1,000 µm to 4,000 µm. Here, the curl value refers to a curl value before the mask 100 is attached to the mask frame 200. For example, the curl value refers to a shortest spacing distance between the substrate 300 and one end of the mask 100. This will be described below with reference to FIG. 5.

The mask 100 may be formed by electroplating. A method of manufacturing the mask 100 will be described later with reference to FIGS. 13 to 18.

Figure 2:
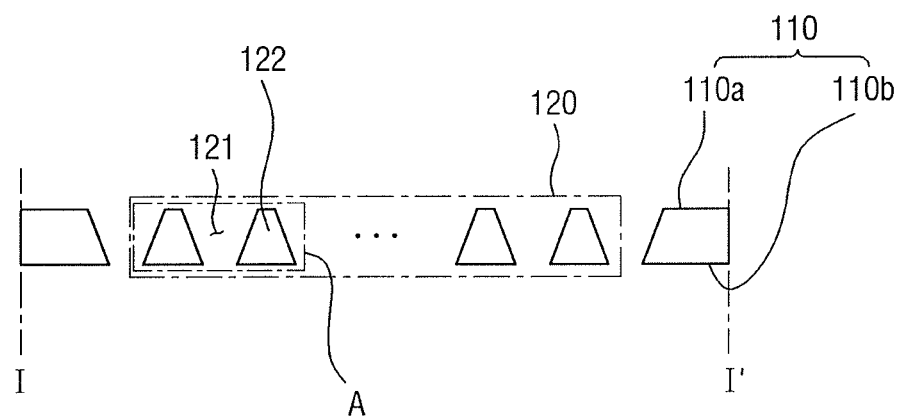
FIG. 2 illustrates a cross-sectional view taken along the line I-I' of FIG. 1.
Figure 2:
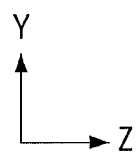
Figure 3:
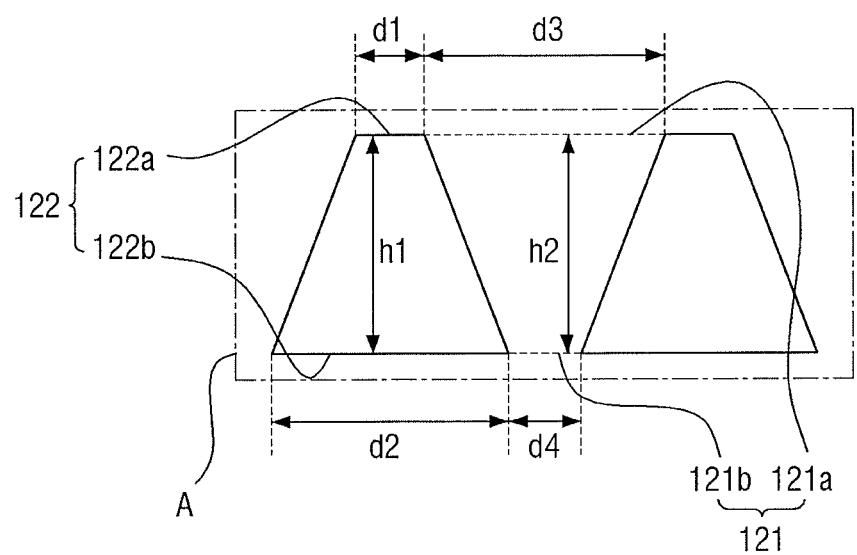
FIG. 3 illustrates a view showing the area A of FIG. 2 in more detail.

FIG. 2 illustrates a cross-sectional view taken along the line I-I' of FIG. 1. FIG. 3 illustrates a view showing the area A of FIG. 2 in more detail.

Referring to FIGS. 2 and 3, the pattern 120 may include a plurality of pattern holes 121 and a plurality of ribs 122. In an implementation, the plurality of pattern holes 121 may be alternately arranged with the plurality of ribs 122. The rib 122 may have a parallelogram or trapezoidal section cut along the third direction Z of FIG. 1. An upper surface 122a of the rib 122 may be on the same side as the second surface 110a of the body 110. The lower surface 122b of the rib 122 may be on the same side as the second surface 110b of the body 110. A length d1 of the upper surface 122a of the rib 122 may be shorter than the length d2 of the lower surface 122b of the rib 122 (d1<d2). The thickness h1 of the rib 122 may be equal to the thickness of the pattern region G3.

The pattern hole 121 may include a virtual upper surface (e.g., upper opening) 121a and a virtual bottom surface (e.g., bottom opening) 121b. The pattern hole 121 may be disposed between at least two ribs 122. For example, the length d1 of the upper surface 122a of the rib 122 may be shorter than the length d2 of the lower surface 122b of the rib 122, and the length d3 of the virtual upper surface 121a of the pattern hole 121 may be longer than the length d4 of the virtual lower surface of the pattern hole 121 (d3>d4). The upper opening 121a of the pattern hole 121 may be on the same side as the first surface 110a of the body 110, the deposition material being applied to the first surface 110. A depth h2, which defined as a shortest distance from the upper opening 121a of the pattern hole 121 to the lower opening 121b of the pattern hole 121, may be equal to the thickness h1 of the rib 122 and the thickness of the pattern region G3. Hereinafter, the thickness of the pattern region G3 is also represented by h1.

As described above, the thickness of the pattern region G3 may be about 6 µm to 10 µm, and each of the thickness h1 of the rib 122 and the depth h2 of the pattern hole 121 may be about 6 µm to 10 µm.

Figure 4:
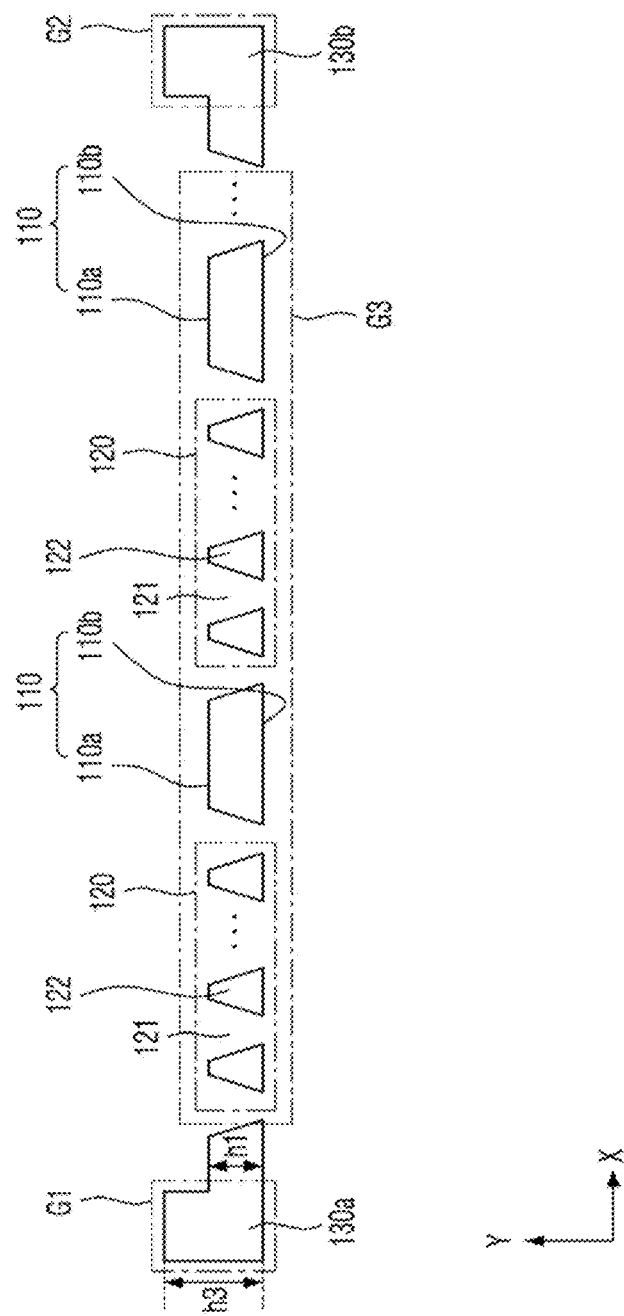
FIG. 4 illustrates a cross-sectional view taken along the line II-II' of FIG. 1.

FIG. 4 illustrates a cross-sectional view taken along the line II-II' of FIG. 1. However, for the convenience of explanation, only the two patterns 120 will be shown in FIG. 4. Further, a duplicate description may be omitted.

Referring to FIG. 4, the rib 122 may have a parallelogram or trapezoidal section cut along the first direction X of FIG. 1. For example, the rib 122 may have a shape of a quadrangular pyramid frustum. Therefore, each of the upper surface 122a and lower surface 122b of the rib 122 may have a square shape.

The thickness h3 of each of the first and second welding regions G1 and G2 may be greater than the thickness h1 of the pattern region G3. For example, each of the first and second welding regions G1 and G2 may be formed by performing an additional plating process, and thickness of each of the first and second welding regions G1 and G2 may be different from the thickness of the pattern region G3. In an embodiment, the thickness of the pattern region G3 may be about 6 µm to 10 µm. In an implementation, the thickness of each of the first and second welding regions G1 and G2 may be about 6 µm to 40 µm. For example, the thickness h3 of each of the first and second welding regions G1 and G2 may be equal to the thickness h1 of the pattern region G3, or may be greater than the thickness h1 of the pattern region G3.

Figure 5:
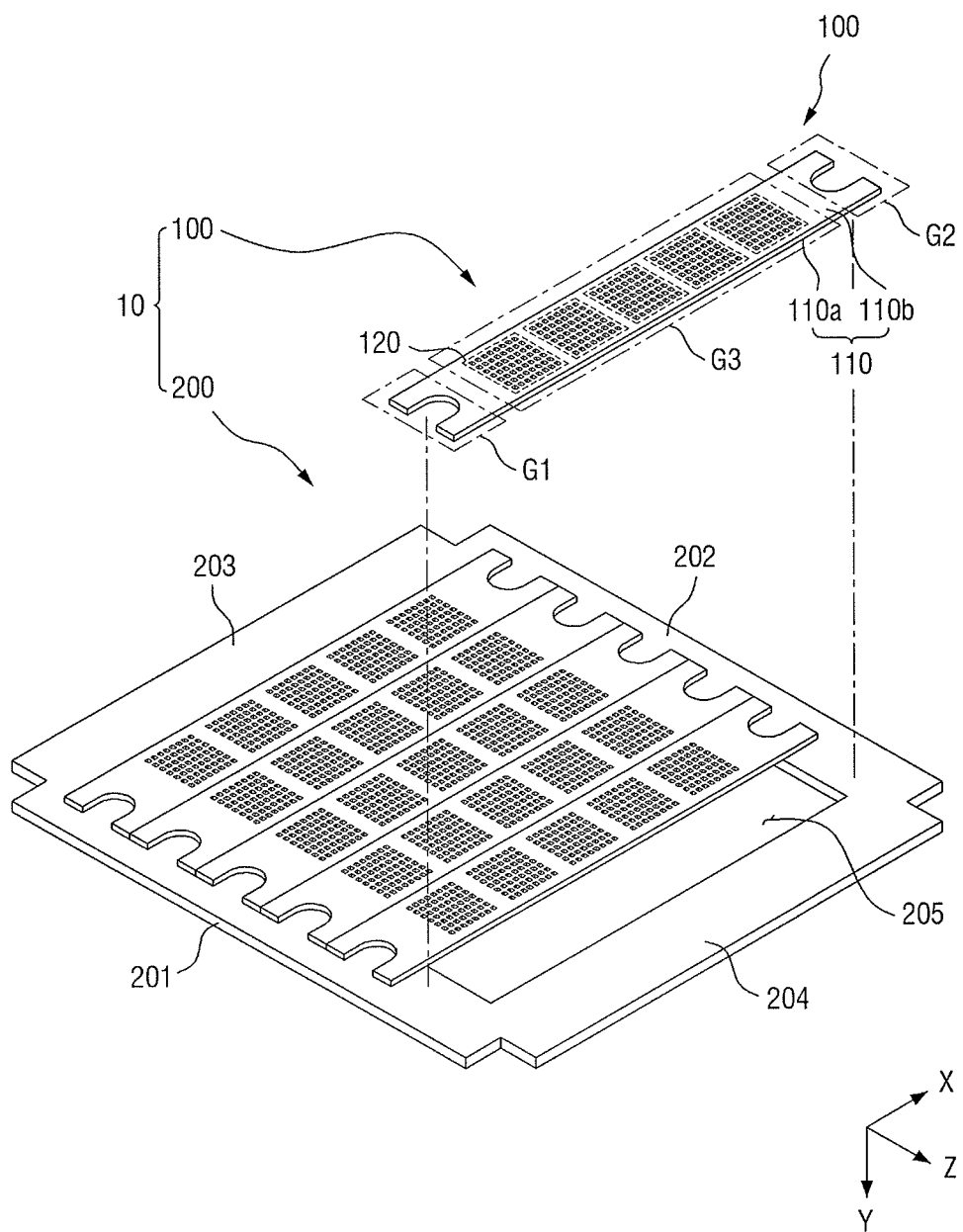
FIG. 5 illustrates a perspective view of a mask assembly according to an embodiment.

FIG. 5 illustrates a perspective view of a mask assembly according to an embodiment. Repeated descriptions overlapping with FIGS. 1 to 4 may be omitted.

Referring to FIG. 5, a mask assembly 10 may include a plurality of masks 100 and a mask frame 200.

The mask frame 200 may include first to fourth support portions or regions 201 to 204. The first support portion 201 and the second support portion 202 may be disposed to be spaced apart from each other along the first direction X. In an embodiment, the first support portion 201 and the second support portion 202 may be disposed in parallel to each other. The third support portion 203 and the fourth support portion 204 may be disposed to be spaced apart from each other along the third direction Z. In an embodiment, the third support portion 203 and the fourth support portion 204 may be disposed in parallel to each other. Ends of the first to fourth support portions 201 to 204 may be connected with each other to form an outer frame (e.g., a continuous outer frame) of the mask assembly 10. The mask frame 200 may further include an opening 205 formed by connecting the first to fourth support portions 201 to 204 with each other. In an implementation, as shown in FIG. 5, the mask frame 200 may have a roughly rectangular shape.

The mask frame 200 may be made of a rigid metal in order to reduce the deformation occurring when welding the plurality of masks 100.

The first and second welding regions G1 and G2 of each of the plurality of masks 100 may be supported by the first and second support portions 201 and 202. The pattern regions G3 of the plurality of masks 100 may overlap the opening 205. The plurality of masks may cover the entire opening 205.

In an implementation, when attaching the plurality of masks 100 to the mask frame 200, the first surface 110a may be in contact with the first and second support portions 201 and 201. For example, the plurality of masks 100 may be formed such that the first surface 110a, to which the deposition material applied, is oriented in the second direction Y.

The plurality of masks 100 may be disposed to be adjacent to each other along the third direction Z. In an embodiment, the plurality of masks 100 may be disposed such that lateral sides are in direct contact with each other, or may be spaced apart from each other at predetermined intervals.

Each of the plurality of masks 100 may have a curl value of about 1,000 µm to 4,000 µm before being attached to the mask frame 200. When attaching the plurality of masks 100 to the mask frame 200, the corresponding mask 100 may be stretched by applying a force along the first direction X, and may then be attached to the mask frame 200. For example, the mask 100 attached to the mask frame 20 may have a (+) curl value. In an implementation, the curl value of the mask 100 after attaching may be, e.g., about 0 µm to 400 µm.

Hereinafter, the definition of curl or curl value will be described with reference to FIGS. 6A and 6B.

Figure 6A:
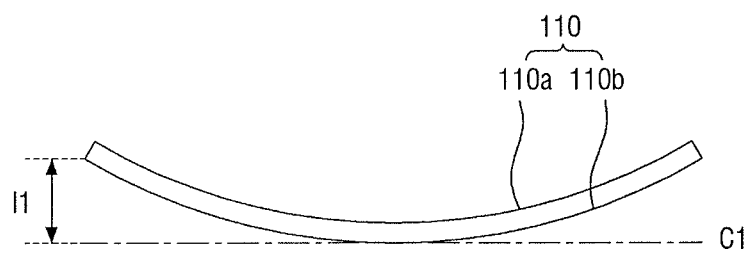
FIG. 6A illustrates a side view schematically showing a mask having a (+) curl value.

FIG. 6A illustrates a side view schematically showing a mask having a (+) curl value. FIG. 6B illustrates a side view schematically showing a mask having a (−) curl value. Here, first and second reference surfaces C1 and C2 may refer to virtual or reference surfaces.

Referring to FIG. 6A, the mask 100 may have a predetermined curvature radius with respect to the first reference surface C1. For example, both ends of the mask 100 may be spaced apart from the first reference surface C1 by a predetermined distance. Here, the first reference surface C1 may be a surface being in contact with the second surface 110b of the mask 100. For example, the first reference surface C1 may be one surface of a substrate (300, refer to FIG. 7) to be described below or a suitable flat surface underlying the mask 100 (e.g., a plane tangent to the curve of the mask 100 at a center of the mask 100). A case of both ends of the mask 100 being warped to be spaced from one surface of the substrate 300 by a predetermined distance may be defined as (+) curl. Further, the spaced distance 11 corresponds to a (+) curl value.

Figure 6B:
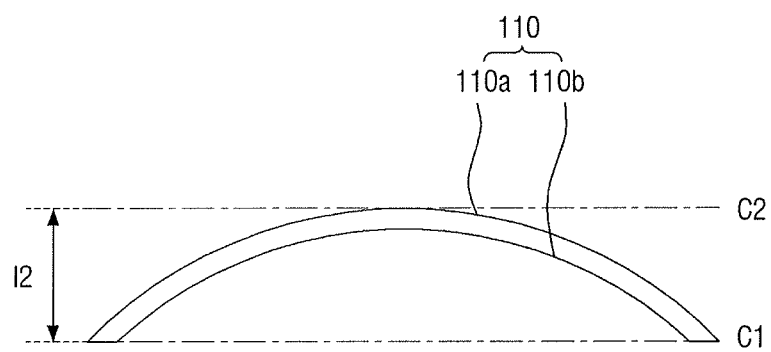
FIG. 6B illustrates a side view schematically showing a mask having a (−) curl value.

Referring to FIG. 6B, both ends of the mask may be warped in a direction toward the first reference surface C1. For example, the mask 100 may have a predetermined curvature radius with respect to a second reference surface C2. Here, the second reference surface C2 may be a surface being in contact with the first surface 110a of the mask 100 (e.g., a plane tangent to the curve of the mask 100 at a center of the mask 100). For example, the second reference surface C2 may be formed in a direction in which a deposition source 400 (to be described below) is located. A case of both ends of the mask 100 being warped to be spaced from the second reference surface C2, which is formed in a direction in which the deposition source 400 is located, by a predetermined distance may be defined as (−) curl. For example, the spaced distance 12 corresponds to a (−) curl value.

In the present specification, when the curl value is (−), "−" is added to a numerical value. For example, when the curl is (+) and 1,000 µm, the curl value may be expressed by 1,000 µm. Further, when the curl is (−) and 1,000 µm, the curl value may be expressed by −1,000 µm. When the curl value is 0, it means that the curvature of the mask is 0.

The curl of the mask 100 may be generated by the kind of the mask 100 or the internal plating stress or tension in the process of forming the mask 100, stretching the mask 100, or attaching the mask 100 to the mask frame 200.

This will be described in more detail with reference to FIG. 8.

First, a deposition apparatus and a deposition process using the deposition apparatus will be described with reference to FIG. 7.

Figure 7:
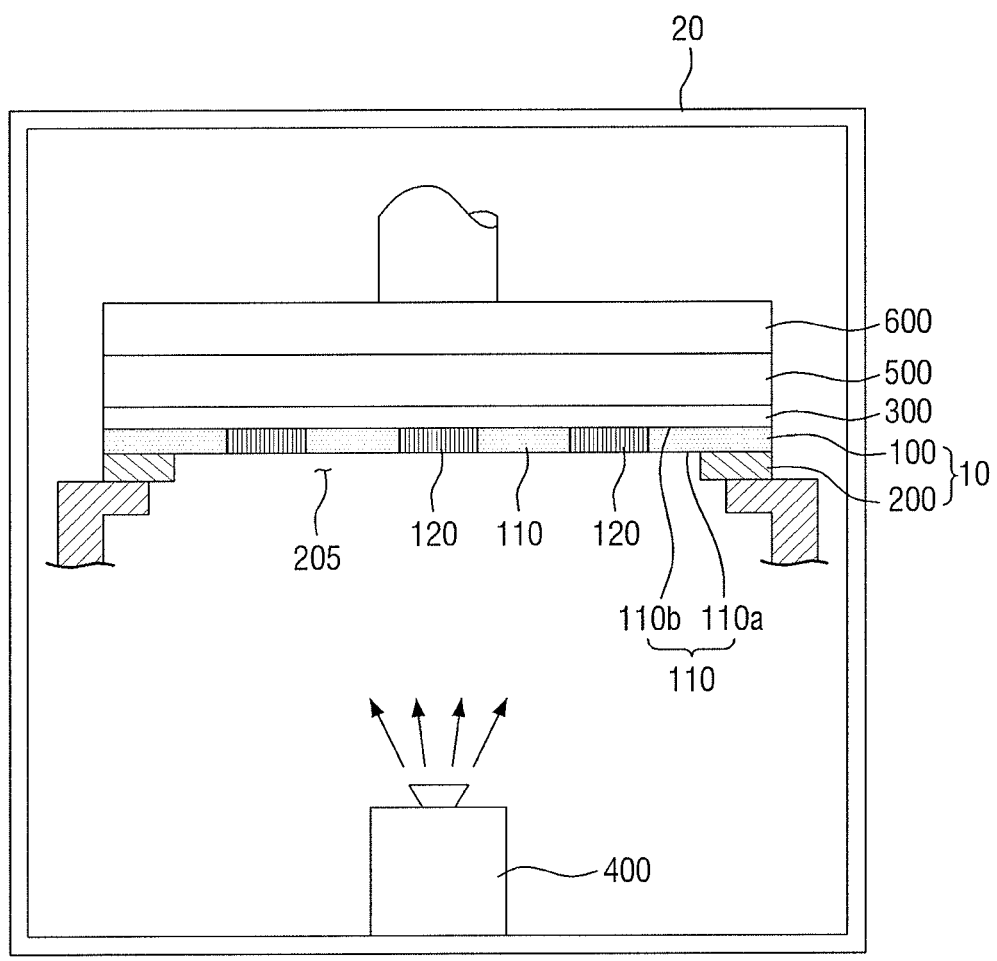
FIG. 7 illustrates a schematic view showing a deposition apparatus according to an embodiment.

FIG. 7 illustrates a schematic view showing a deposition apparatus according to an embodiment. The contents overlapping with those described with reference to FIGS. 1 to 6 may be omitted. Further, in FIG. 7, for the convenience of explanation, the mask 100 may have three patterns 120.

Referring to FIG. 7, the deposition apparatus may include a chamber 20, a deposition source 400, a magnet plate 600, and a pressing plate 500.

The chamber 20 may be provided therein with a deposition source 400, a mask assembly 10, a magnet plate 600, and a pressing plate 500.

The deposition source 400 may apply a deposition material in a direction toward one side of a substrate 300. The mask assembly 10 may be disposed on one side of the substrate 300. The mask assembly 10 may include a mask 100 and a mask frame 200 to which the mask 100 is attached. Here, the mask 100 may be disposed such that the first surface 110a thereof is located or facing toward the deposition source 400, and the second surface 110b thereof is in contact with the substrate 300.

Thus, the mask 100 may be disposed such that the upper opening 122a of the pattern hole (121, refer to FIG. 3) is located or open toward the deposition source 400, and thus may efficiently receive a deposition material from the deposition source 400.

The magnet plate 600 may be disposed on the other side of the substrate 30. The magnet plate 600 may bring the mask assembly 10 disposed on one side of the substrate 300 into close contact with the substrate 300 using a magnetic force. The pressing plate 50 may be interposed between the magnet plate 600 and the substrate 300. The pressing plate 500 may help improve the adhesion between the substrate 300 and the mask assembly 10 before the magnet plate 600 applies a magnetic force to the mask assembly 10.

Figure 8:
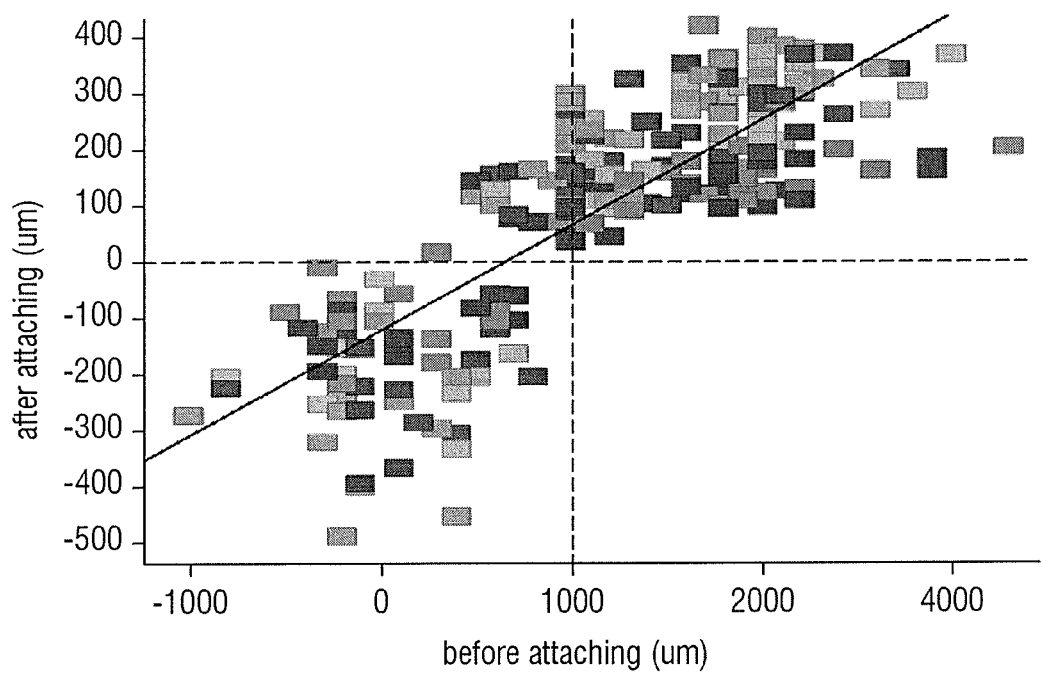
FIG. 8 illustrates graph comparing the curl values of a mask according to an embodiment before stretching and after stretching.

FIG. 8 illustrates graph comparing the curl values of a mask according to an embodiment before attaching and after attaching. The square shown in FIG. 8 represents one mask, and, as a result, FIG. 8 shows the distribution of curl values of a plurality of masks.

The curl value of the mask 100 according to an embodiment may be about 1,000 μm to 4,000 μm before attaching the mask 100 to the mask frame 200. Then, the mask 100 may be stretched, and then attached to the mask frame 200 by welding. The curl value of the attached mask 100 may be (+) or 0. The curl value of the mask 100 may be about 0 μm to 400 μm after attaching the mask 100 to the mask frame 200. Thus, an undesirable shadow phenomenon may be advantageously reduced. In an implementation, the tensile resultant force may be, e.g., about 0.4 Kgf to 6.0 Kgf per mask 100.

Referring to FIG. 8, it can be seen that, in the case where the curl value of the mask 100 is between 1,000 μm and 4,000 μm, the curl value of the mask 100 may be 0 μm to 400 μm when the mask 100 is attached to the mask frame 200.

In contrast, when the curl value of the mask 100 is 1,000 μm or less before the mask 100 is attached to the mask frame 200, the mask 100 may have a (−) curl value when the mask 100 is attached to the mask frame 200.

If the mask 100 were to have a (−) curl value after the mask 100 is attached to the mask frame 200, defective lifting could be induced by the mutual interference between the substrate 300 and the mask 100, and this defective lifting could cause an undesirable shadow phenomenon.

Figure 9A:
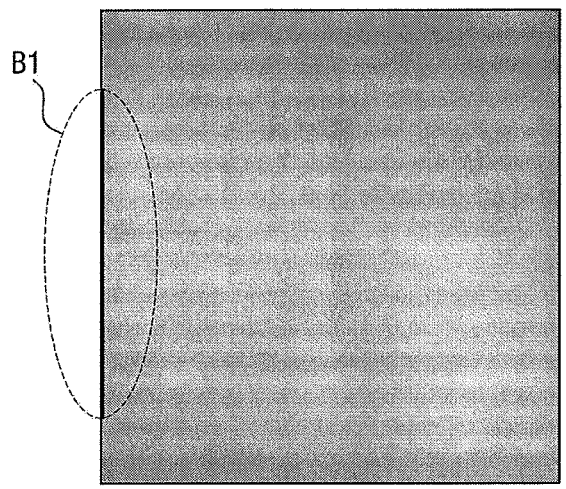
FIGS. 9A and 9B illustrate views showing a shadow phenomenon caused by a mask assembly according to a comparative embodiment.
Figure 9B:
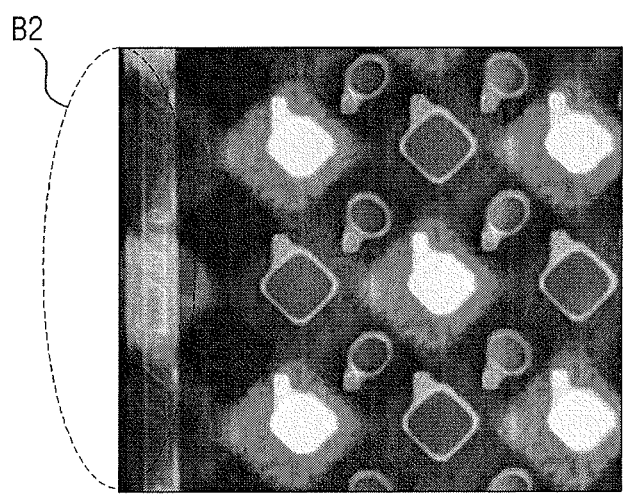
Figure 10A:
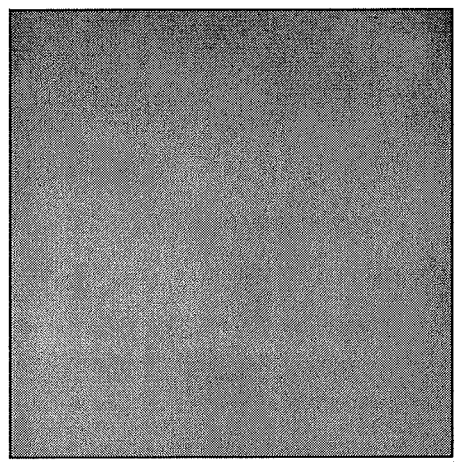
FIGS. 10A and 10B illustrate views showing a case where a shadow phenomenon is reduced by a mask assembly according to an embodiment.
Figure 10B:
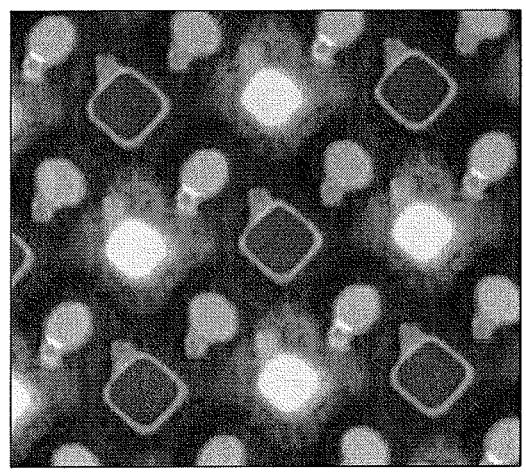

FIGS. 9A and 9B illustrate views showing a shadow phenomenon caused by a mask assembly according to a comparative embodiment. FIGS. 10A and 10B illustrate views showing a case where a shadow phenomenon is reduced by a mask assembly according to an embodiment.

Here, the mask assembly according to a comparative embodiment exemplifies a case where the curl value of a mask is (−) after the mask is attached to the mask assembly.

Referring to FIGS. 9A and 9B, when the curl value of a mask is (−) after the mask is attached to the mask assembly, a shadow phenomenon may occur in the area B1 of the mask assembly due to the occurrence of spacing between the mask and the substrate (300, refer to FIG. 7). Such a shadow phenomenon may cause a side lifting phenomenon (area B2) of a display panel manufactured by a deposition apparatus using the mask assembly according to a comparative embodiment, and thus precise patterns may not be formed.

In contrast, according to an embodiment, the curl value of the mask 100 may be about 1,000 μm to 4,000 μm before the mask 100 is attached to the mask frame 200, and the mask 100 attached to the mask frame 200 may have a (+) or 0 curl value. Referring to FIG. 10A, it can be seen that the shadow phenomenon in the mask assembly 10 may be reduced. Further, it may also be possible to prevent the side lifting phenomenon of a display panel manufactured by the deposition apparatus using the mask assembly 10 according to an embodiment.

Hereinafter, the curl value of the mask 100 and shadow phenomenon after attaching the mask 100 to the mask frame 200 with respect to the condition of the mask 100 before attaching the mask 100 to the mask frame 200 will be described with reference to FIGS. 11 and 12 and Tables 1 and 2.

Figure 11:
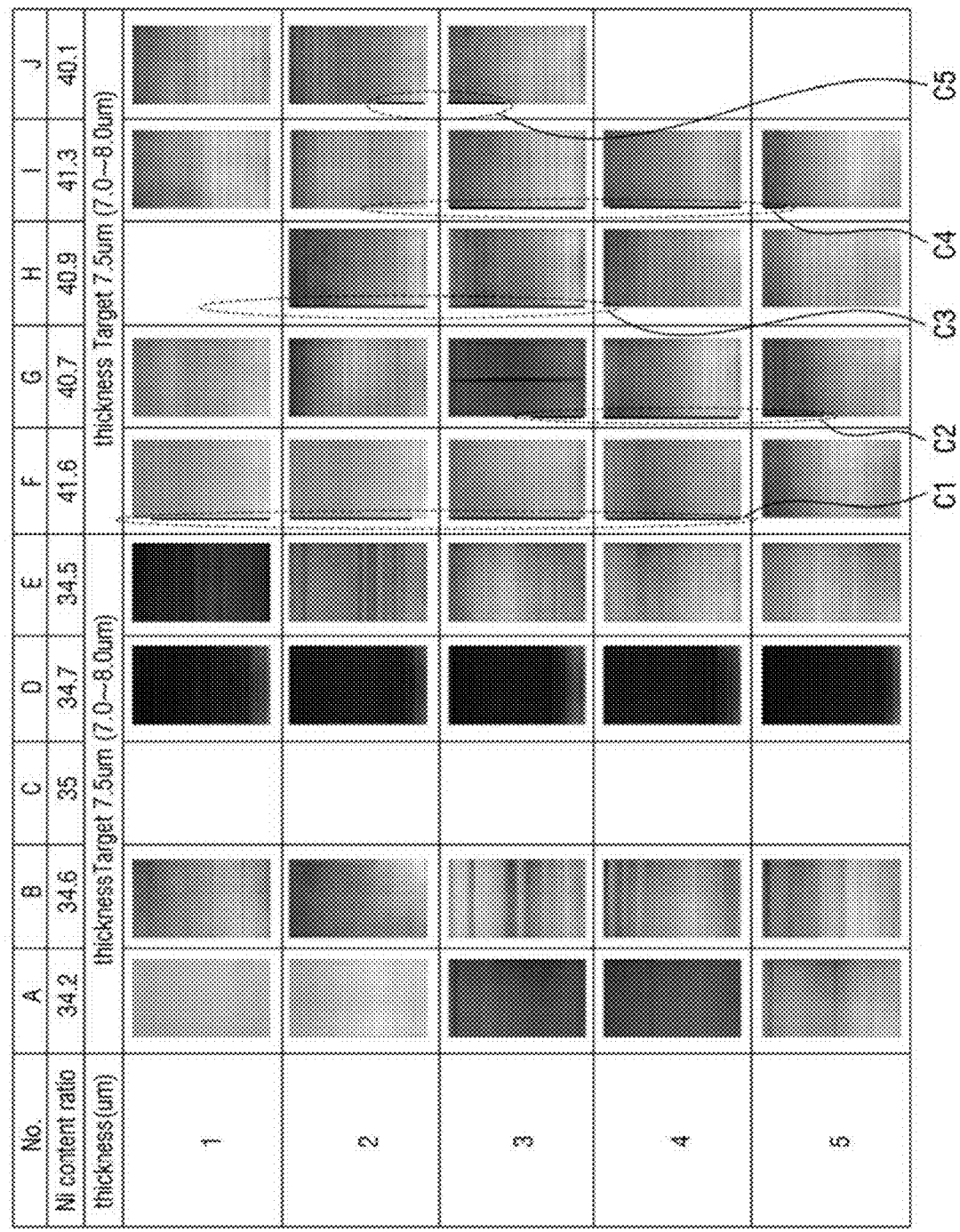
FIG. 11 illustrates a view showing the shadow phenomenon of a mask assembly after attaching a mask to a mask frame depending on the nickel content ratio of the mask before attaching the mask to the mask frame.

FIG. 11 illustrates a view showing the shadow phenomenon of a mask assembly after attaching a mask to a mask frame depending on the nickel content ratio of the mask before attaching the mask to the mask frame. Here, A to E of FIG. 11 represent masks having different nickel content ratios from each other according to an embodiment. In contrast, F to J of FIG. 11 represent masks having different nickel content ratios from each other according to a comparative embodiment. Meanwhile, for clear comparison, the thickness of each of the masks 100 according to an embodiment is equal to the thickness of each of the masks according to a comparative embodiment.

TABLE 1

| | A | | B | | C | | D | | E | |
|---|---|---|---|---|---|---|---|---|---|---|
| | L | R | L | R | L | R | L | R | L | R |
| 1 | 1900 | 1000 | 2200 | 1000 | 2000 | 1200 | 1500 | 1100 | 1800 | 1100 |
| 2 | 2000 | 1200 | 2000 | 1000 | 1900 | 1000 | 1000 | 1100 | 2000 | 1100 |
| 3 | 2100 | 1300 | 1900 | 1100 | 2000 | 1300 | 1800 | 1200 | 1700 | 1200 |
| 4 | 2200 | 2000 | 1800 | 1300 | 2000 | 1100 | 1500 | 1400 | 1800 | 1300 |
| 5 | 1700 | 1800 | 1800 | 1400 | 1800 | 1100 | 1300 | 1200 | 1800 | 1800 |

| | F | | G | | H | | I | | J | |
|---|---|---|---|---|---|---|---|---|---|---|
| | L | R | L | R | L | R | L | R | L | R |
| 1 | −100 | 100 | −200 | −100 | −300 | −100 | −100 | −100 | 600 | 100 |
| 2 | −200 | 100 | −100 | −100 | −200 | −400 | −300 | −200 | 100 | 300 |
| 3 | −100 | 100 | −100 | −300 | −200 | −400 | −300 | −100 | 100 | 0 |
| 4 | −100 | 200 | −100 | −200 | −200 | −200 | −200 | −100 | 0 | 400 |
| 5 | −100 | 100 | −500 | −100 | −100 | −100 | −300 | 100 | 0 | 400 |

(L: left, R.: right)

Table 1 shows the curl values of the masks before attaching the masks to the mask frame. Here, left (L) refers to the curl value of one end of each of the masks, and right (R) refers to the curl value of the other end of each of the masks, the other end thereof facing (e.g., opposite to) the one end thereof.

The content of nickel (Ni) in the mask 100 according to an embodiment may be 35 wt % to 40 wt %, based on the total weight of nickel (Ni) and iron (Fe).

For example, in the case of all A to E, the content of nickel (Ni) was 35 wt % to 40 wt % based on the total weight of nickel (Ni) and iron (Fe). Referring to Table 1, in the case of all A to E, the content of nickel (Ni) satisfies the above range, and thus the curl value of each of the masks 100 before being attached to the mask frame 200 may be about 1,000 μm to 4,000 μm.

Accordingly, referring to FIG. 11, it may be seen that a shadow phenomenon did not occur in the mask assembly 10 including the mask 100 according to an embodiment.

In contrast, in the case of the mask according to a comparative embodiment, the content of nickel (Ni) was more than 40 wt % based on the total weight of nickel (Ni) and iron (Fe). Referring to Table 1, in the case of all F to J, the content of nickel (Ni) was more than 40 wt % based on the total weight of nickel (Ni) and iron (Fe), and thus the curl value of each of the masks before being attached to the mask frame was be set to about 1,000 μm or less or a (−) curl value.

Accordingly, referring to FIG. 11, it may be seen that, in the case of the mask assembly including the mask according to a comparative embodiment, a shadow phenomenon occurred in the first to fifth areas C1 to C5.

Figure 12:
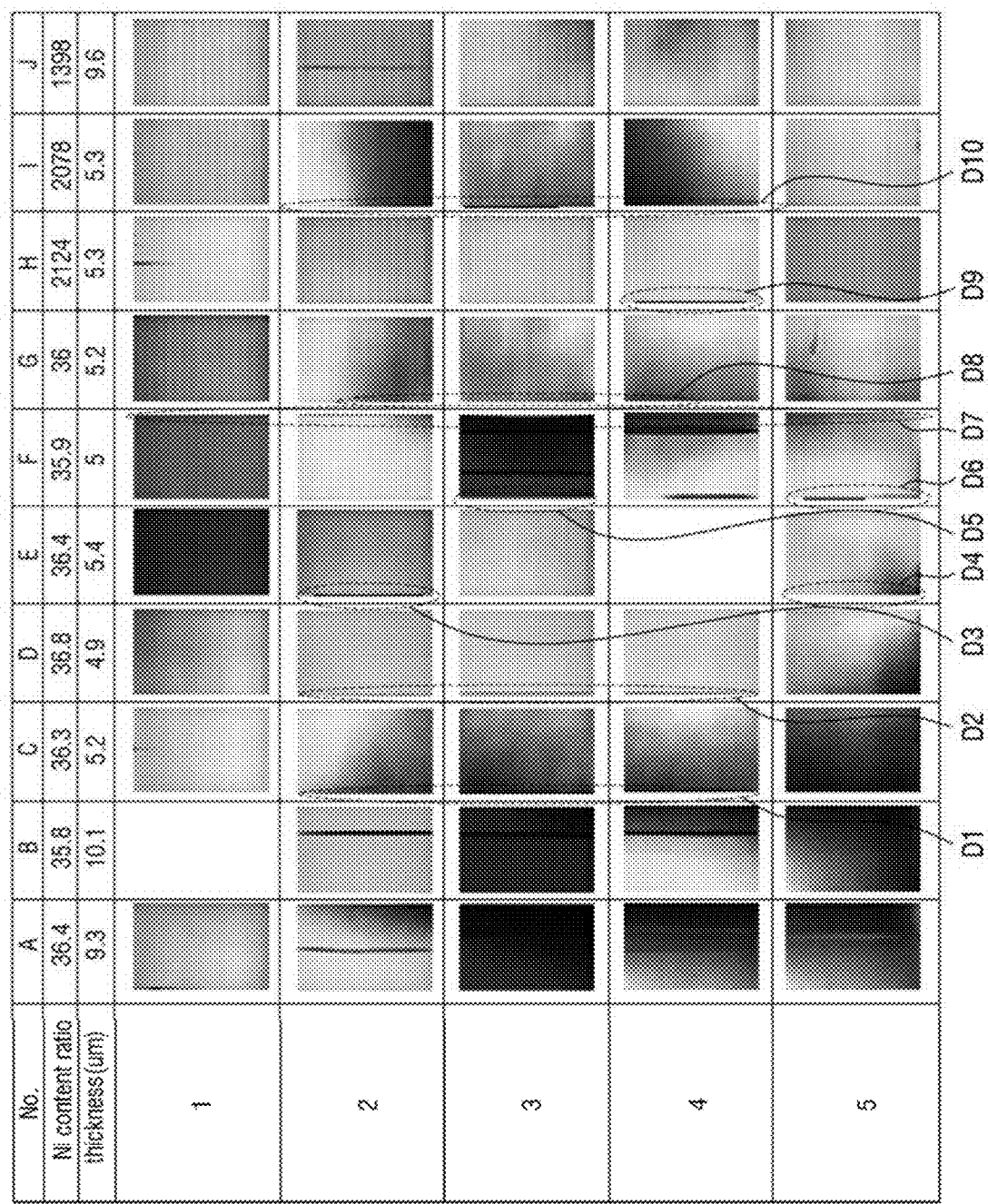
FIG. 12 illustrates a view showing the shadow phenomenon of a mask assembly after attaching a mask to a mask frame depending on the thickness of the mask before attaching the mask to the mask frame.

FIG. 12 illustrates a view showing the shadow phenomenon of a mask assembly after attaching a mask to a mask frame depending on a thickness of the mask before attaching the mask to the mask frame. Here, A, B and J of FIG. 12 represent masks each having a thickness of about 6 μm to 10 μm according to an embodiment (B had a thickness of 10.1 μm, but which was considered to be substantially the same as 10). In contrast, C, D, E, and F of FIG. 12 represent masks each having a thickness of about less than 6 μm according to a comparative embodiment. Meanwhile, for clear comparison, the content of nickel (Ni) in each of the masks 100 according to an embodiment and the content of nickel (Ni) in each of the masks according to a comparative embodiment were set to 36 wt % based on the total weight of nickel (Ni) and iron (Fe). Further, here, the thickness of the mask 100 refers to the thickness of the pattern region G3.

TABLE 2

| A | | B | | C | | D | | E | |
|---|---|---|---|---|---|---|---|---|---|
| L | R | L | R | L | R | L | R | L | R |
| 1 | 2600 | 2800 | 2600 | 2800 | 400 | 200 | 1000 | 500 | 200 | 800 |
| 2 | 3700 | 3200 | 4000 | 3900 | 200 | 100 | 800 | 100 | 100 | 100 |
| 3 | 3500 | 4000 | 3900 | 4200 | 0 | 0 | 400 | 0 | 0 | 0 |
| 4 | 3000 | 4000 | 3300 | 4000 | 200 | 0 | 400 | 0 | 0 | 0 |
| 5 | 2200 | 2600 | 2600 | 3000 | 300 | 100 | 0 | 500 | 800 | 0 |

| F | | G | | H | | I | | J | |
|---|---|---|---|---|---|---|---|---|---|
| L | R | L | R | L | R | L | R | L | R |
| 1 | −300 | −500 | 200 | −500 | 400 | 100 | −500 | −200 | 6000 | 3000 |
| 2 | −100 | −1100 | 300 | −100 | 300 | 100 | −100 | −200 | 3900 | 3900 |
| 3 | −100 | −1200 | 100 | −100 | 0 | 100 | −200 | −400 | 4000 | 3800 |
| 4 | −100 | −800 | −200 | 200 | 100 | 100 | −100 | −300 | 3800 | 4100 |
| 5 | −600 | −1100 | 0 | −500 | 300 | 300 | −400 | −300 | 2500 | 2900 |

(L: left, R: right)

Table 2 shows the curl values of the masks before attaching the masks to the mask frame.

The thickness of each of the masks 100 according to an embodiment may be about 6 μm to 10 μm. For example, in the case of all A, B, and J, the thickness of each of the mask 100 was about 6 μm to 10 μm. Referring to Table 2, in the case of all A, B, and J, each of the masks 100 were formed to have a thickness of about 6 μm to 10 μm, and thus the curl value of each of the masks 100 before being attached to the mask frame 200 may be about 1,000 μm to 4,000 μm.

Accordingly, referring to FIG. 12, it may be seen that a shadow phenomenon did not occur in the mask assembly 10 including the mask 100 according to an embodiment.

In contrast, in the case of each of the masks according to a comparative embodiment, the thickness of each of the mask was less than 6 μm. For example, in the case of all C to F, the thickness of each of the mask was less than 6 μm. Referring to Table 2, the thickness of each of the mask was less than 6 μm, and thus the curl value of each of the masks before being attached to the mask frame may be about 1,000 μm or less or a (−) curl value.

Accordingly, referring to FIG. 12, it may be seen that, in the case of the mask assembly including the mask according to a comparative embodiment, a shadow phenomenon occurred in the first to tenth areas D1 to D10.

For example, the mask 100 may have a curl value of about 1,000 μm to 4,000 μm before the mask 100 is attached to the mask frame 200, and the mask 100 may be formed to have a curl value of about 0 μm to 400 μm after the mask is stretched and then attached to the mask frame 200. Through this, a shadow phenomenon may be advantageously reduced, thereby preventing the side lifting phenomenon of a display panel. In an implementation, the curl value of the mask 100 before being attached to the mask frame 200 may be about 1,000 μm to 4,000 μm, and the content of nickel (Ni) in the mask 100 may be about 35 wt % to 40 wt % based on the total weight of nickel (Ni) and iron (Fe). Further, the thickness of the mask 100 may be about 6 μm to 10 μm.

Next, a method of manufacturing a mask will be described with reference to FIGS. 13 to 18.

FIGS. 13 to 18 illustrate sectional views of stages in a method of manufacturing a mask.

Figure 13:
FIGS. 13 to 18 illustrate sectional views of stages in a method of manufacturing a mask.
Figure 14:
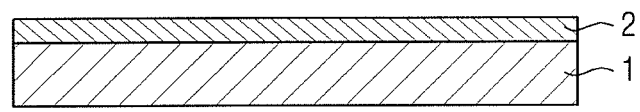

Referring to FIGS. 13 and 14, a first photoresist layer 2 may be formed on a substrate 1. The first photoresist layer 2 may be formed on the substrate 1 by applying a positive or negative photoresist onto the substrate 1.

Before forming the photoresist layer 2 on the substrate 1, one side of the substrate 1 may be polished. Thus, the first photoresist layer 2 may be uniformly formed on one side of the substrate 1.

Figure 15:
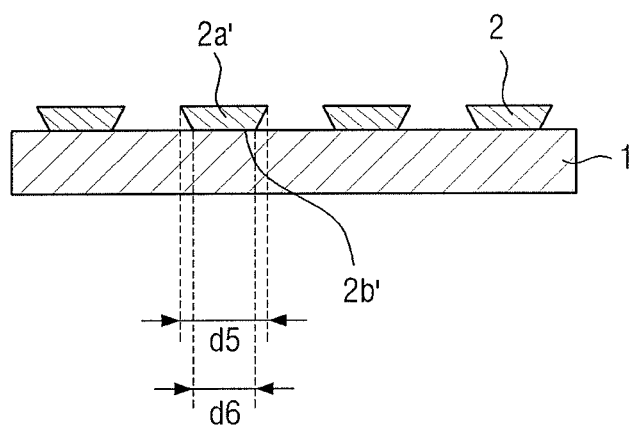

Next, referring to FIG. 15, the first photoresist layer 2 may be selectively developed by performing a photolithography process. As a result, a plurality of first photoresist patterns 2' may be formed. For example, a first photomask corresponding to the plurality of first photoresist patterns may be formed, and an exposure process of exposing a part of the first photoresist layer 2 blocked by the photomask to light may be performed. Thus, the first photoresist layer 2 may be selectively developed, so as to form the plurality of first photoresist patterns 2' on one side of the substrate 1.

Here, in the first photoresist pattern 2', the length d5 of the upper surface 2a' thereof may be longer than the length d6 of the lower surface 2b' thereof. For example, both sides of the first photoresist pattern 2' may have a reverse tapered shape.

Figure 16:
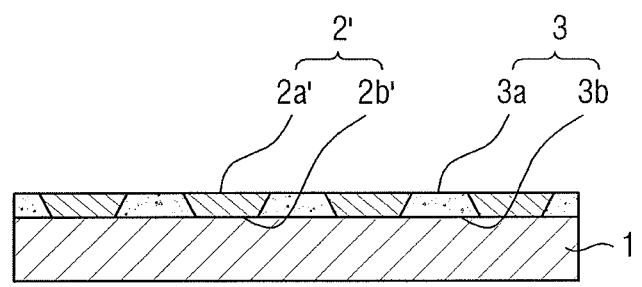

Next, referring to FIG. 16, a metal layer 3 may be formed between the plurality of first photoresist pattern 2'. In an implementation, the metal layer 3 may be formed by electroplating. Therefore, the substrate 1 may include a conductive material.

Here, the metal layer 3 may include a nickel (Ni) plating solution. In an implementation, the component ratio of the nickel (Ni) plating solution may be about 30 wt % to 70 wt % of the total plating solution. A stress relieving agent may include a surfactant. The stress relieving agent may include a suitable material capable of relieving the stress in the metal layer 3. The content of the stress relieving agent in the total plating solution may be about 1 wt % to 10 wt %. A predetermined constant current may be applied to the metal layer 3. Here, the curl value of the mask may be controlled by adjusting the amount of the constant current. Here, the adjustment of weight ratio of the nickel (Ni) plating solution, the adjustment of weight ratio of the stress relieving agent, and the control of the constant current may be each independently performed. Further, all or some of the adjustment of weight ratio of the nickel (Ni) plating solution, the adjustment of weight ratio of the stress relieving agent, and the control of the constant current may be performed.

In an implementation, the method of manufacturing a mask may further include the step of forming a plurality of pattern holes (121, refer to FIG. 18) by etching the metal layer 3.

Figure 17:
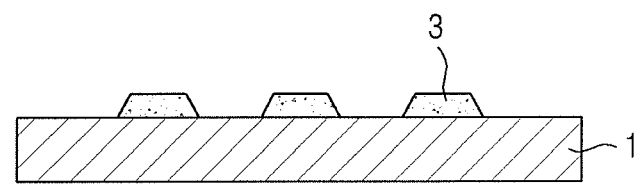
Figure 18:
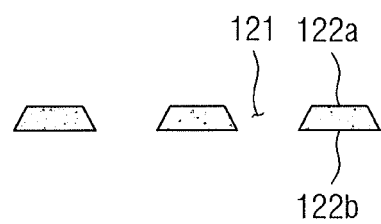

Next, referring to FIG. 17, the plurality of first photoresist patterns 2' may be removed. As a result, only the metal layer 3 may be present on one side of the substrate 1. Next, referring to FIG. 18, the substrate 1 may be removed. Thus, a mask 100 including a plurality of pattern holes 121 and a plurality of ribs 122 may be formed.

The mask 100 formed by these processes may have a curl value of about 1,000 μm to 4,000 μm. Further, the content of nickel (Ni) in the mask 100 may be 35 wt % to 40 wt % based on the total weight of nickel (Ni) and iron (Fe), and the thickness of the pattern region G3 of the mask 100 may be about 6 μm to 10 μm.

By way of summation and review, the electrodes and light-emitting layer included in the organic light-emitting display device may be formed by a deposition method. As the organic light-emitting display device has higher resolution, the width of the open slit of a mask used in a deposition process may gradually decrease.

In the case of a high-resolution organic light-emitting display device, a deposition process may be performed while a substrate and a mask are in close contact with each other.

As described above, according to embodiments of the present invention, there can be provided a mask that can eliminate or reduce a shadow phenomenon, and a method of manufacturing a mask assembly including the mask.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A mask comprising a body, the body including:
   one end and another end facing each other in a length direction and having a first surface and a second surface facing each other in a thickness direction; and
   a pattern region between the one end and the another end, the pattern region including a plurality of pattern holes and a plurality of ribs between the plurality of pattern holes,
   wherein:
   a curl value of the mask, which is defined as a shortest distance from a plane tangent to a center of the body to the one end or the another end of the body when the mask is in an unattached state, is 1,000 μm to 4,000 μm, and
   each of the plurality of ribs includes an upper surface having a first length, a lower surface having a second length, and a side surface connecting the upper surface and the lower surface, the second length being longer than the first length, and the side surface is inclined,
   wherein the body includes nickel and iron,
   wherein a content of nickel is 35 wt % to 40 wt %, based on a total weight of nickel and iron,
   wherein a thickness of at least one of the plurality of ribs is 6 μm to 10 μm.

2. The mask as claimed in claim 1, wherein the body includes a first welding region at the one end and a second welding region at the another end.

3. The mask as claimed in claim 2, wherein a thickness of at least one of the first welding region and the second welding region is greater than a thickness of at least one of the plurality of ribs.

4. The mask as claimed in claim 2, wherein a thickness of at least one of the first welding region and the second welding region is 6 μm to 40 μm.

5. The mask as claimed in claim 1, wherein each rib of the plurality of ribs includes an upper surface having a first length and a lower surface having a second length, the second length being longer than the first length.

6. The mask as claimed in claim 1, wherein:
   the plurality of pattern holes includes a virtual upper surface and a virtual bottom surface; and
   a length of the virtual upper surface of the pattern holes is longer than a length of the virtual bottom surface of the pattern holes.

* * * * *